US009964976B2

(12) United States Patent
Conte et al.

(10) Patent No.: US 9,964,976 B2
(45) Date of Patent: *May 8, 2018

(54) VOLTAGE REGULATOR WITH IMPROVED ELECTRICAL PROPERTIES AND CORRESPONDING CONTROL METHOD

(71) Applicant: STMicroelectronics S.r.l., Agrate Brianza (IT)

(72) Inventors: Antonino Conte, Tremestieri Etneo (IT); Carmelo Paolino, Palermo (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/596,895

(22) Filed: May 16, 2017

(65) Prior Publication Data

US 2017/0248981 A1  Aug. 31, 2017

Related U.S. Application Data

(63) Continuation of application No. 14/969,103, filed on Dec. 15, 2015, now Pat. No. 9,684,324.

(30) Foreign Application Priority Data

May 27, 2015 (IT) .................. 102015000018398

(51) Int. Cl.
*G05F 1/575* (2006.01)
*H02M 3/07* (2006.01)
(Continued)

(52) U.S. Cl.
CPC ............... *G05F 1/575* (2013.01); *G05F 1/56* (2013.01); *H02M 3/07* (2013.01); *H03F 1/34* (2013.01); *H03F 1/42* (2013.01); *H03F 3/45* (2013.01)

(58) Field of Classification Search
CPC ..... G05F 1/14; G05F 1/42; G05F 1/52; G05F 1/56; G05F 1/63; G05F 1/455;
(Continued)

(56) References Cited

U.S. PATENT DOCUMENTS 5,563,501 A  10/1996 Chan
5,648,718 A *  7/1997 Edwards ................. G05F 1/565
   323/274

(Continued)

FOREIGN PATENT DOCUMENTS

CN  101552552 A  10/2009
CN  103064455 A  4/2013
CN  103838290 A  6/2014

OTHER PUBLICATIONS

Garimella et al., "Frequency Compensation Techniques for op-amps and LDOs: A Tutorial Overview," IEEE 54th International Midwest Symposium on Circuits and Systems, Aug. 2011, pp. 1-4.
(Continued)

*Primary Examiner* — Yemane Mehari
(74) *Attorney, Agent, or Firm* — Slater Matsil, LLP (57) ABSTRACT

A voltage-regulator device includes an error-amplifier stage configured to receive a first reference voltage and a feedback voltage, an output amplifier stage coupled to the error-amplifier stage and configured to generate an output voltage related to the first reference voltage by an amplification factor, and a feedback stage configured to generate the feedback voltage. A compensation stage is configured to implement a second feedback loop, and cause, in response to a variation of the output voltage, a corresponding variation of a first biasing voltage for the output amplifier stage. The compensation stage includes a coupling-capacitor element coupled between the output amplifier stage and a first internal node, and a driving module coupled between the
(Continued)

first internal node, and the output amplifier stage and configured to generate a compensation voltage for driving the output amplifier stage.

17 Claims, 10 Drawing Sheets (51) Int. Cl.
*H03F 3/45* (2006.01)
*H03F 1/34* (2006.01)
*H03F 1/42* (2006.01)
*G05F 1/56* (2006.01)

(58) Field of Classification Search
CPC .......... G05F 1/575; G05F 1/607; G05F 1/648; Y02B 70/1466; H02M 3/07; H02M 3/156–3/158; H03F 1/34; H03F 1/42; H03F 1/45
USPC ........ 323/268, 269, 273, 280, 281, 290–305
See application file for complete search history.

(56) References Cited

U.S. PATENT DOCUMENTS

| | | | |
|---|---|---|---|
| 6,246,221 B1 | 6/2001 | Xi | |
| 6,977,490 B1* | 12/2005 | Zhang | G05F 1/575 |
| | | | 323/280 |
| 7,495,422 B2 | 2/2009 | Mok et al. | |
| 8,169,203 B1 | 5/2012 | Vemula | |
| 8,866,450 B2 | 10/2014 | Kirchner | |
| 9,684,324 B2* | 6/2017 | Conte | G05F 1/575 |
| 2003/0111986 A1* | 6/2003 | Xi | G05F 1/575 |
| | | | 323/280 |
| 2009/0237046 A1 | 9/2009 | Hsieh et al. | |
| 2010/0127775 A1 | 5/2010 | Tadeparthy et al. | |
| 2010/0181982 A1 | 7/2010 | Chen et al. | |
| 2011/0267017 A1 | 11/2011 | Zhang et al. | |
| 2013/0015831 A1 | 1/2013 | Wong et al. | |
| 2013/0285631 A1 | 10/2013 | Bisson et al. | |

OTHER PUBLICATIONS

Kamal, et al., "Full On-Chip CMOS Low Dropout Voltage Regulator Using MOS Capacitor Compensation," IEEE, 2012, 6 pages.

Liu et al., "Design of Off-Chip Capacitor-Free DMOS Low-Dropout Voltage Regulator," IEEE Asia Pacific Conference on Circuits and Systems, Nov. 2008, pp. 1316-1319.

Millikan et al., "Full On-Chip CMOS Low-Dropout Voltage Regulator," IEEE Transactions on Circuits and Systems, vol. 54, No. 9, Sep. 2007, pp. 1879-1890.

Park, C.J., et al., "External Capacitor-Less Low Drop-Out Regulator with 25 dB Superior Power Supply Rejection in the 0.4-4 MHz Range," IEEE Journal of Solid-State Circuits, vol. 49, No. 2, Feb. 2014, 16 pages.

\* cited by examiner

VOLTAGE REGULATOR WITH IMPROVED ELECTRICAL PROPERTIES AND CORRESPONDING CONTROL METHOD

CROSS-REFERENCE TO RELATED APPLICATIONS

This application is a continuation of U.S. patent application Ser. No. 14/969,103, filed on Dec. 15, 2015, and entitled "Voltage Regulator with Improved Electrical Properties and Corresponding Control Method," which application claims the benefit of Italian Patent Application No. 102015000018398, filed on May 27, 2015, which applications are hereby incorporated herein by reference.

TECHNICAL FIELD

The present disclosure relates to a voltage regulator with improved electrical properties and to a related control method.

BACKGROUND

In a typical manner, technological progress in the manufacturing of complementary metal-oxide semiconductor (CMOS) transistors, with ever smaller dimensions and thickness of the corresponding oxides, has led to a progressive reduction in the supply voltages used in the corresponding electronic circuits (in order not to cause damage thereto), for example, down to values in the range of 1 V-1.1 V. However, there is frequently the need to have available voltages different from the supply voltage, in particular a higher value. For this purpose, charge pumps are usually used, possibly combined with voltage regulators, in particular, direct current-direct current (DC/DC) converters, which may need to meet stringent requirements from the standpoint of electrical performance in order not to jeopardize the general performance of the electronic circuits in which they are used.

For example, in nonvolatile memories, in particular of a flash type, operations of reading and programming, or modification, require high operating voltages for the terminals of the memory cells, for example, in the range of 5 V for the reading operations and 10 V for the programming operations. For generation of such operating voltages, charge-pump circuits are used, which, at their input, may require regulated voltages of a value generally higher than the voltage supplied by the supply source, for example, in the range of 1.4 V, for generation of which suitably configured voltage regulators are used.

The electrical performance of these voltage regulators, for example, in terms of static and dynamic consumption levels, output impedance, occupation of area, and stability margins, may be critical, for example, on account of the inefficiency typical of the associated charge pumps. There are also applications entailing stringent safety requirements, for example, in the case of the so-called "Secure MCUs", i.e., microprocessor units for secure applications, for example, banking applications, computer security, payments, etc.

SUMMARY

Generally speaking, a voltage-regulator device comprises an error-amplifier stage configured to receive a first reference voltage and a feedback voltage, an output amplifier stage coupled to the error-amplifier stage, and configured to generate an output voltage related to the first reference voltage by an amplification factor, and a feedback stage coupled to the output amplifier stage and configured to generate the feedback voltage based upon the output voltage for implementing a first feedback loop. The voltage-regulator device comprises a compensation stage coupled in feedback with the output amplifier stage and configured to implement a second feedback loop, and cause, in response to a variation of the output voltage, a corresponding variation of a first biasing voltage for the output amplifier stage. The compensation stage comprises a coupling-capacitor element coupled between the output amplifier stage and a first internal node, and a driving module coupled between the first internal node, and the output amplifier stage and configured to generate a compensation voltage for driving the output amplifier stage.

DETAILED DESCRIPTION OF ILLUSTRATIVE EMBODIMENTS

In this case, additional security requirements may add to the previous requirements relating to electrical performance. The security issues may include, for example, obfuscating observation and understanding from outside, for example, by monitoring the energy absorption from the electrical supply source, the operations performed by the circuit, such as reading or programming operations carried out in the memory.

Figure 1:
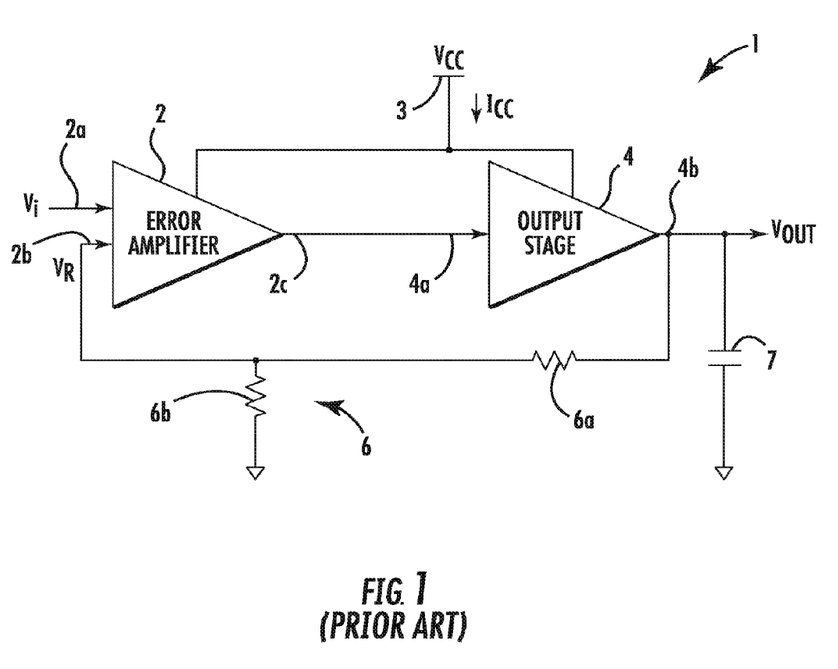
FIG. 1 is a schematic diagram of a voltage regulator, according to the prior art.

FIG. 1 shows a general block diagram of a voltage regulator 1 of a typical type, which may be used, for example, for generation of the regulated input voltage required by a charge-pump circuit in a nonvolatile memory of a flash type. The voltage regulator 1 comprises: an error-amplifier stage 2, which is supplied by a supply source 3 with a supply voltage VCC, of a low value (ICC is the current required of the supply source), and includes one or more operational-amplifier stages, in particular of an Operational Transconductance Amplifier (OTA) type; and error amplifier stage 2 has a first input 2a, receiving a reference voltage Vi, for example, from a band-gap generator (here not illustrated), a second input 2b, designed to receive a feedback voltage VR for implementing a voltage control loop (as described more fully hereinafter), and an output 2C.

The voltage regulator 1 comprises: an output amplifier stage 4, which is also supplied by the supply voltage VCC, and has an input 4a coupled to the output 2c of the error-amplifier stage 2, and an output 4b, which defines the output of the voltage regulator 1 and supplies an output voltage VOUT, for example, amplified by a desired amplification factor with respect to the reference voltage Vi; and a divider stage 6. The divider stage 6 is coupled to the output 4b of the output amplifier stage 4 and is designed to supply the feedback voltage VR, as a division of the output voltage VOUT, in order to implement feedback control of the value of the same output voltage VOUT. In the example illustrated, the divider stage 6 is of a resistive type and thus comprises a first division resistor 6a and a second division resistor 6b, which are coupled in series between the output 4b and a ground reference terminal and define a feedback node present on which is the feedback voltage VR (it is, however, evident that the divider stage 6 could be of a capacitive type, in any case guaranteeing a low absorption of electrical current).

A storage capacitor 7 is further coupled between the output 4b of the output amplifier stage 4 and the ground reference terminal. This storage capacitor 7 has large dimensions and a high value of capacitance, for example, in the range of nanofarads, and thus is generally not made with integrated technology, i.e. it is not made in the same chip as the voltage regulator 1.

The voltage regulator 1 thus implements a voltage control loop, in which the value of the output voltage VOUT is determined by the value of the reference voltage Vi and by the division factor implemented by the divider stage 6 that generates the feedback voltage VR. In particular, the high capacitance of the storage capacitor 7 is required to guarantee low drops in the output voltage ΔVOUT, define a dominant pole in the frequency response of the voltage regulator 1, and rapidly meet the current demand during load transients.

Consequently, in this approach, the voltage regulator 1 may require a high occupation of area for its implementation (in this regard, in a way not illustrated, also the output amplifier stage 4 requires use of PMOS transistors of large dimensions) in order to guarantee good characteristics of regulation as the load and the current demand vary.

The above approach is thus generally not suited to portable or mobile approaches, or in general applications in which the occupation of area represents an important design requirement. Different approaches have consequently been proposed, aimed at reducing area occupation, in particular ones envisaging elimination of the cumbersome storage capacitor 7 and its replacement with an output capacitor of lower capacitance, which may be integrated in the same chip in which the voltage regulator is provided.

For instance, the approach disclosed in "External Capacitor-Less Low Drop-Out Regulator with 25 dB Superior Power Supply Rejection in the 0.4-4 MHz Range", C. J. Park, M. Onabajo, J. Silva-Martinez, JSSC, vol. 49, No. 2, February 2014, discusses possible voltage-regulator approaches aimed at eliminating the external storage capacitor, which has large dimensions. The approaches proposed in the above document may require, however, complex circuit schemes for guaranteeing stability of the circuit and overcoming the absence of the dominant pole due to elimination of the storage capacitor. In particular, the circuit described envisions a pair of amplifiers with limited current capacity and high output impedance, which further introduce a long delay.

The present disclosure notes that existing approaches are not altogether satisfactory, especially in the case where the voltage regulator is used in applications with high security requirements. In fact, none of the typical approaches enables an adequate control of the current consumption at output to be obtained, in particular as regards the so-called "overshoots", which may occur in response to sharp (steplike) variations of the current required by the load (and which, since they may be detected from outside, may jeopardize security of the system).

On the other hand, in radiofrequency (RF) systems operating with reduced electromagnetic fields, it becomes increasingly important for the current responses of the peripherals to be free from peaks that might induce noise in the communication (signal-to-noise ratio). The need is thus certainly felt to provide an improved approach for a voltage regulator, which will make it possible to solve, or at least attenuate, the problems highlighted previously, and in particular that will have improved characteristics in reference to the current consumption and to the security provided, at the same time ensuring a reduced area occupation.

Figure 2:
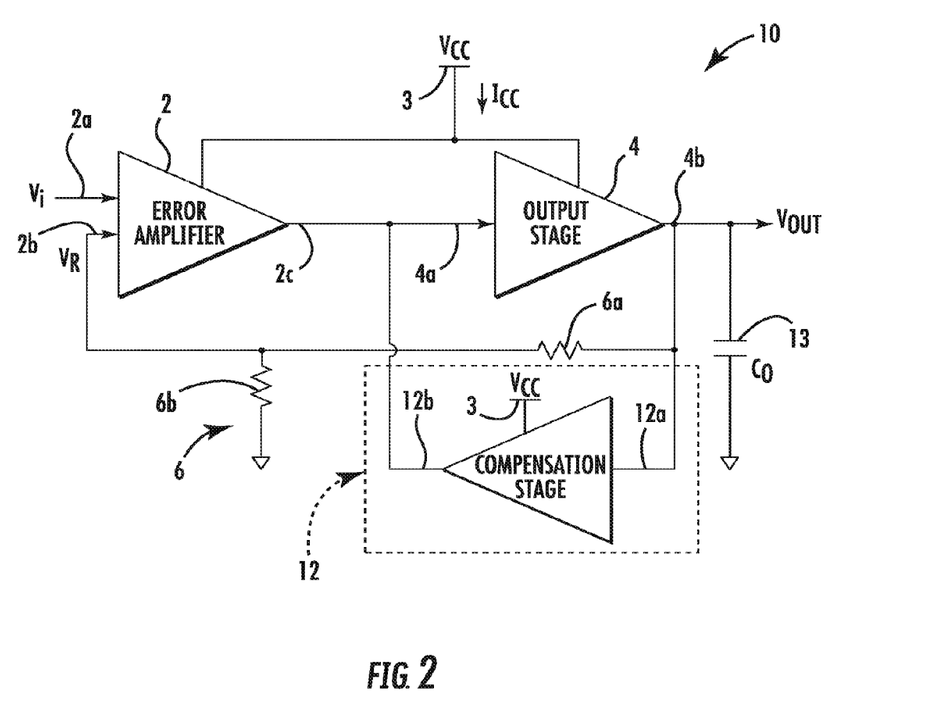
FIG. 2 is a schematic diagram of a voltage regulator, according to the present disclosure.

According to the present disclosure, a voltage regulator, for example for a DC/DC converter, which may be used in a nonvolatile-memory device of a flash type, and a corresponding control method, are consequently provided. As illustrated in FIG. 2, a voltage regulator 10 according to one embodiment of the present approach has a configuration similar to that of the voltage regulator 1 illustrated in FIG. 1, thus comprising (designated by the same reference numbers and not described again in detail): an error-amplifier stage 2; an output amplifier stage 4; and a divider stage 6.

The voltage regulator 10 further comprises a compensation amplifier stage 12, having a compensation input 12a coupled to the output 4b of the output amplifier stage 4, and a compensation output 12b coupled to the input 4a of the same output amplifier stage 4 (and to the output 2C of the error-amplifier stage 2). The compensation amplifier stage 12 is further coupled to the supply source 3 for receiving the supply voltage VCC.

According to an aspect of the present approach, the compensation amplifier stage 12 is configured to implement a pure derivator (i.e., with a transfer function substantially given by s·KF, without poles at least in the operating frequencies of the voltage regulator 10, and defined by a single zero) and an output impedance that is substantially infinite, for small signal, in the absence of current demand by the load. In other words, the presence of the derivator does not perturb the static biasing conditions of the system.

As described in detail hereinafter, the presence of the compensation amplifier stage 12 enables reduction of the value of capacitance C0 required for the capacitor 13 at output from the voltage regulator 10. In this case, the output capacitor 13, coupled between the output 4b of the output amplifier stage 4 and the ground reference terminal, may thus be integrated in the same chip of the voltage regulator 10 and has a reduced value of capacitance C0, for example, in the range of 100 pF. The compensation amplifier stage 12 introduces into the voltage regulator 10 a further control loop, faster than the external voltage control loop (implemented by the error-amplifier stage 2 on the basis of the feedback voltage VR), which enables a fast reaction to the current demands at output. In particular, the compensation amplifier stage 12 obtains a dominant pole at output from the error-amplifier stage 2, as desired, and also a reduced overshoot in the current ICC required from the supply source 3 and a high stability in regard to the load variations (i.e. it allows to obtain a large phase margin).

Figure 3:
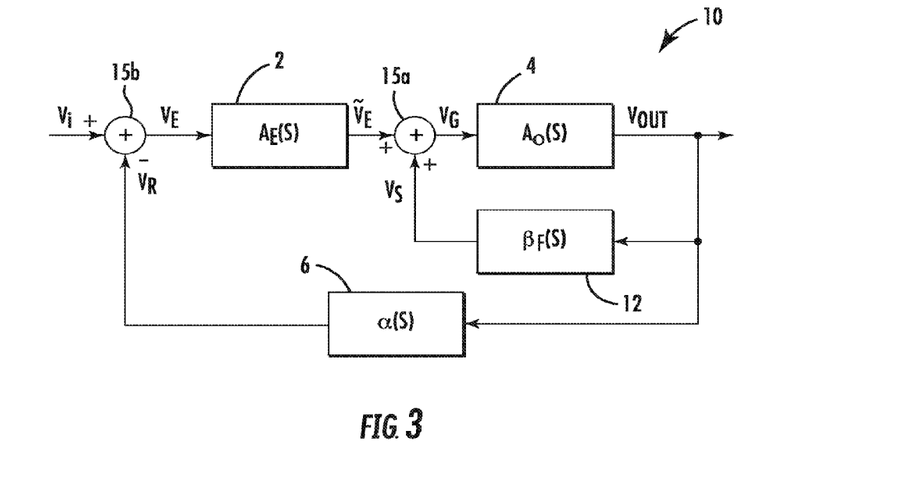
FIG. 3 shows an equivalent block diagram of the voltage regulator of FIG. 2.

FIG. 3 shows the voltage regulator 10 (for determination of the transfer function), where VS denotes the compensation voltage generated by the compensation amplifier stage 12, which is combined in a first adder block 15a with the amplified error voltage $\tilde{V}_E$, at the output of the error-amplifier stage 2, to generate the biasing voltage VG for biasing the output stage 4, in particular a gate terminal of at least one corresponding output PMOS transistor (here not shown; for this reason, in what follows, the biasing voltage VG will be defined as "gate biasing voltage").

In the same FIG. 3, designated by VE is the error voltage, which is the result of the difference, in a second adder block 15b, between the reference voltage Vi and the feedback voltage VR. Furthermore, AE(s) denotes the transfer function of the error-amplifier stage, AO(s) denotes the transfer function of the output amplifier stage 4, βF(s) denotes the transfer function of the compensation stage 12, and α(s) denotes the transfer function of the divider stage 6.

In particular, the following expressions apply:

$$\alpha(s) = \alpha$$

$$\beta_F(s) = s \cdot K_F$$

$$A_O(s) = \frac{-A_O}{\left(1 + \frac{s}{\omega_{po}}\right)}$$

$$A_E(s) = \frac{-A_{E0}}{\left(1 + \frac{s}{\omega_{pe}}\right)}.$$

The open-loop transfer function of the voltage regulator 10 is thus given by $$T(s) = \frac{\alpha \cdot A_{E0} \cdot A_O}{\left(1 + \frac{s}{\omega_{pe}}\right) \cdot \left(1 + \frac{s}{\omega_{pt}}\right)}$$

and has a dominant pole at low frequency $\omega_{pt}$, separate from a pole at high frequency $\omega_{pe}$ $$\omega_{pt} \ll \omega_{pe}.$$

The ratio between these two frequencies depends upon the sizing of the circuit, but normally may be assumed of the order of 100. In particular, the following expression applies:

$$\omega_{pt} = \frac{\omega_{po}}{1 + K_F \cdot A_O \cdot \omega_{po}} \rightarrow \omega_{pt} \approx \frac{1}{K_F \cdot A_O}.$$

The position of the dominant pole ωpt is thus determined by the value of the gain factor KF of the compensation amplifier stage 12. It should be noted that the separation (or splitting) between the poles is obtained thanks to the presence of the pure derivator introduced in the further control loop. The approach described does not use Miller pole-splitting technique so as not to incur in the known problems regarding PSRR (Power-Supply Rejection Ratio) and RHZ (Right-Half-plane Zero). The dominant pole ωpt has a very low frequency in such a way that control problems in the closed loop do not arise and a large phase margin is obtained. In particular, there is a reduced sensitivity of the properties of stability to capacitive variations of the load.

Figure 4:
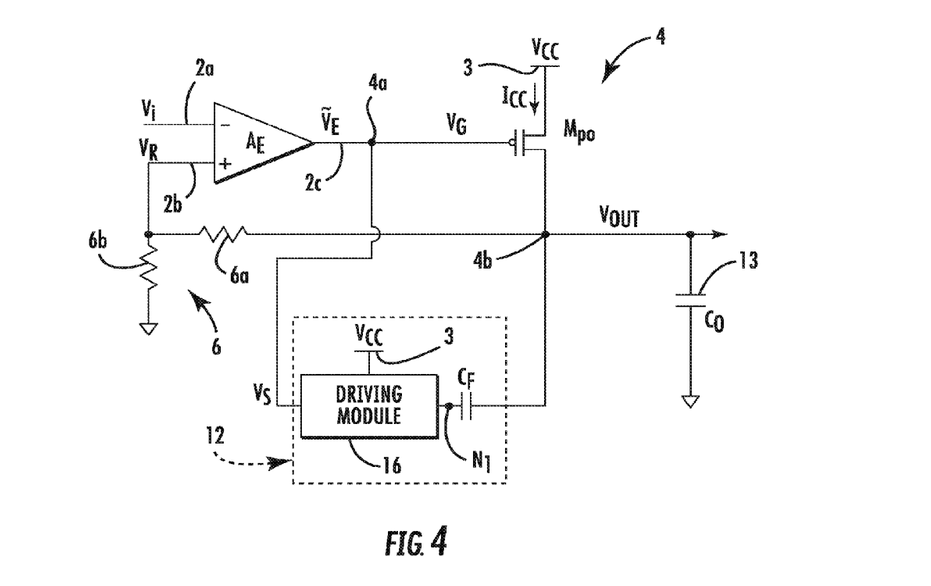
FIG. 4 is a schematic circuit diagram of the voltage regulator of FIG. 2.

With reference to FIG. 4, a description of a possible implementation of the compensation amplifier stage 12, designed to implement the transfer function discussed previously, is described. In FIG. 4, the output amplifier stage 4 includes an output PMOS transistor, designated by Mp0, which is coupled between the output 4b and the supply source 3 that supplies the supply voltage VCC and has its gate terminal coupled to the input 4a (and to the output 2c of the error-amplifier stage 2).

The compensation amplifier stage 12 in this case comprises: a coupling-capacitor element CF, which couples the output 4b of the output amplifier stage 4 to an internal node N1 of the compensation amplifier stage 12; and a driving module 16, coupled at its input to the internal node N1 and designed to generate the compensation voltage VS for driving the gate terminal of the output PMOS transistor Mp0. The capacitive coupling determined by the coupling-capacitor element CF causes the driving module 16 to have a high sensitivity, and a substantially immediate response to any variation of the output voltage VOUT, and consequent efficient driving of the output PMOS transistor Mp0. In this way, it is possible to obtain reduced voltage drops on the output 4b and reduced overshoots in the current consumption from the supply source (i.e., in the current ICC).

Figure 5:
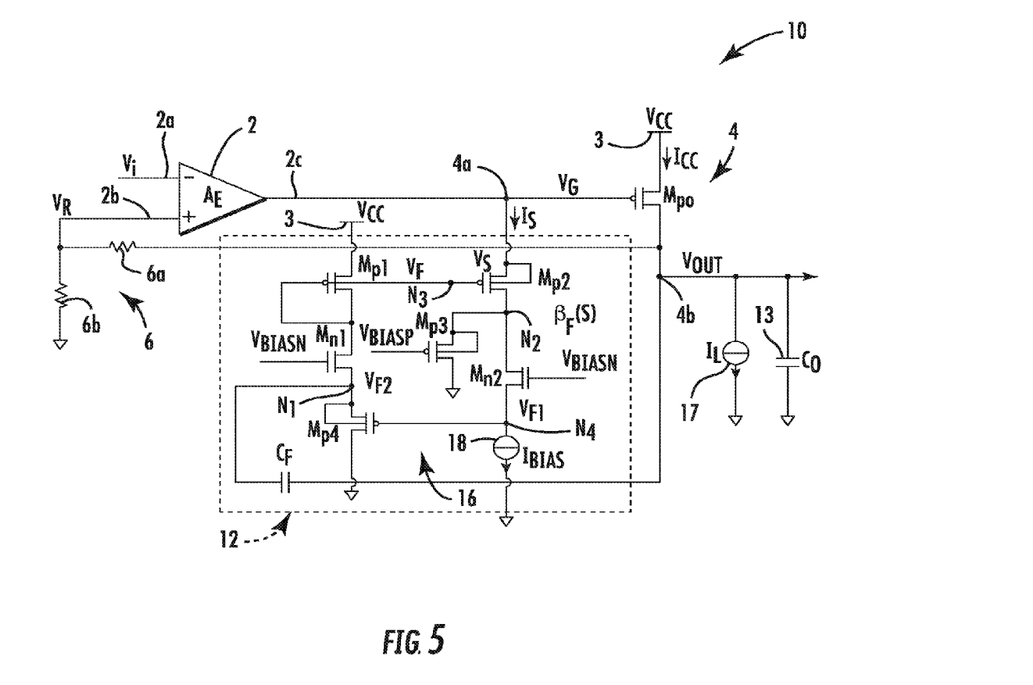
FIG. 5 is a schematic circuit diagram of a compensation stage in the voltage regulator of FIG. 2.

With reference to FIG. 5, a possible circuit implementation of the driving module 16 of the compensation amplifier stage 12 is now described. The driving module 16 is configured to generate a substantially instantaneous current path towards the input 4a of the output amplifier stage 4, for the gate capacitance of the output PMOS transistor Mp0, following upon a variation of the output voltage ΔVOUT, due to a load transient and the corresponding step of the load current IL at the output 4b of the output amplifier stage 4 (as represented by a load current generator 17, coupled between the output 4b and the ground terminal).

The above current path, enabled upon the variation of output voltage ΔVOUT, generates a corresponding variation of the gate voltage for driving the output PMOS transistor Mp0. In detail, the current path is determined by: a discharge PMOS transistor Mp2 in source-follower configuration designed to enable driving of the output PMOS transistor Mp0 (thus acting as a driver), which is coupled between the input 4a of the output amplifier stage 4 (i.e., the gate terminal of the output PMOS transistor Mp0) and an internal node N2, and has a respective gate terminal coupled to an internal node N3, on which a voltage VF is present; and a biasing PMOS transistor Mp3, which is coupled between the internal node N2 and the ground reference terminal and has its gate terminal that receives a p-biasing voltage VBIASP.

The driving module 16 further comprises: a coupling PMOS transistor Mp1, which is diode-coupled but is sufficiently resistive in such a way as to enable a considerable variation of voltage on the gate terminal of the discharge PMOS transistor Mp2 when the latter is required to intervene in driving of the output PMOS transistor Mp0, having a first conduction terminal that is coupled to the supply source 3 and receives the supply voltage VCC, and a second current-conduction terminal and its gate terminal that are both coupled to the internal node N3. The driving module 16 further comprises: a first biasing NMOS transistor Mn1, which is coupled between the second current-conduction terminal of the coupling PMOS transistor Mp1 and the internal node N1, on which a voltage VF2 is present, and has a gate terminal that receives a n-biasing voltage VBIASN. The driving module 16 further comprises: a second biasing NMOS transistor Mn2, coupled between the internal node N2 and an internal node N4, on which a voltage VF1 is present, with its gate terminal that receives the n-biasing voltage VBIASN; a biasing-current generator 18, which supplies a biasing current IBIAS to the internal node N4; and an enabling PMOS transistor Mp4, which is coupled between the internal node N1 and the ground reference terminal and has its gate terminal coupled to the internal node N4.

During operation, the demand at output for load current IL causes a voltage drop ΔVOUT, which, as a result of the capacitive coupling of the coupling-capacitor element CF, in turn causes a corresponding step-like decrease of the voltage VF2 on the internal node N1. On account of this variation of the voltage VF2, the enabling PMOS transistor Mp4 turns off, and the coupling PMOS transistor Mp1 goes into a state of greater conduction, causing a decrease in voltage VF. In turn, the decrease in voltage VF causes the discharge PMOS transistor Mp2 to go into a state of greater conduction, with setting-up of the discharge-current path through the same discharge PMOS transistor Mp2 and the biasing PMOS transistor Mp3.

The current IS that flows along the discharge-current path thus causes a decrease in the gate voltage VG on the gate terminal of the output PMOS transistor Mp0, in response to the voltage drop ΔVOUT, and an increase of the current that flows across the output PMOS transistor Mp0, in a way corresponding to the requirement of the load. The reaction of the circuit is very fast thanks to the role performed by the discharge PMOS transistor Mp2, which is able to conduct a high amount of current and to turn on the output PMOS transistor MP0 rapidly, notwithstanding the high capacitive load due to the size of the output PMOS transistor MP0.

Figure 6:
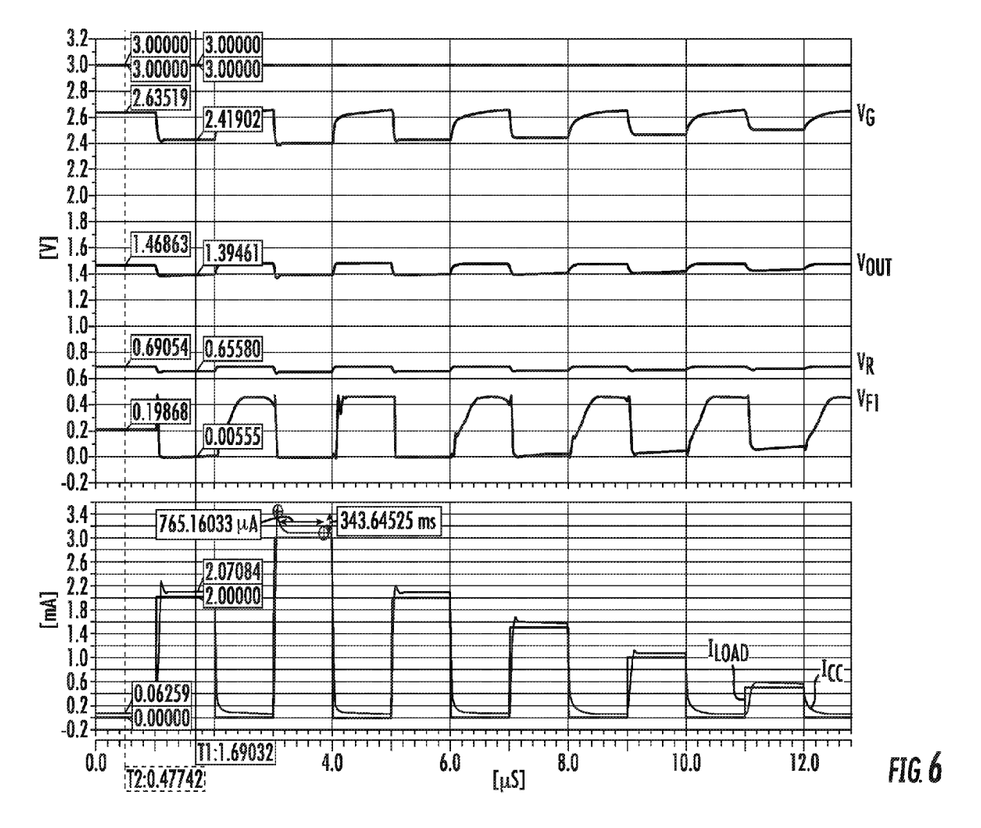
FIGS. 6 and 7A-7B are diagrams of electrical signals in the voltage regulator of FIG. 2.

Possible plots of the significant electrical quantities in the driving module 16 are shown in FIG. 6, in response to steplike variations of the load current IL, highlighting the operation described in detail previously. In particular, from an analysis of these plots, the following may be noted: the high stability and absence of oscillations on the gate voltage $V_G$; the limited value of the overshoots in the current $I_{CC}$ required of the supply source 3, which are at the most in the range of 10% with respect to the maximum value of the steps of the load current $I_L$; and the limited value of the voltage drop $\Delta V_{OUT}$, which in the example is just 100 mV (for a current step that goes from 0 to 3 mA in just 10 ns).

Figure 7A:
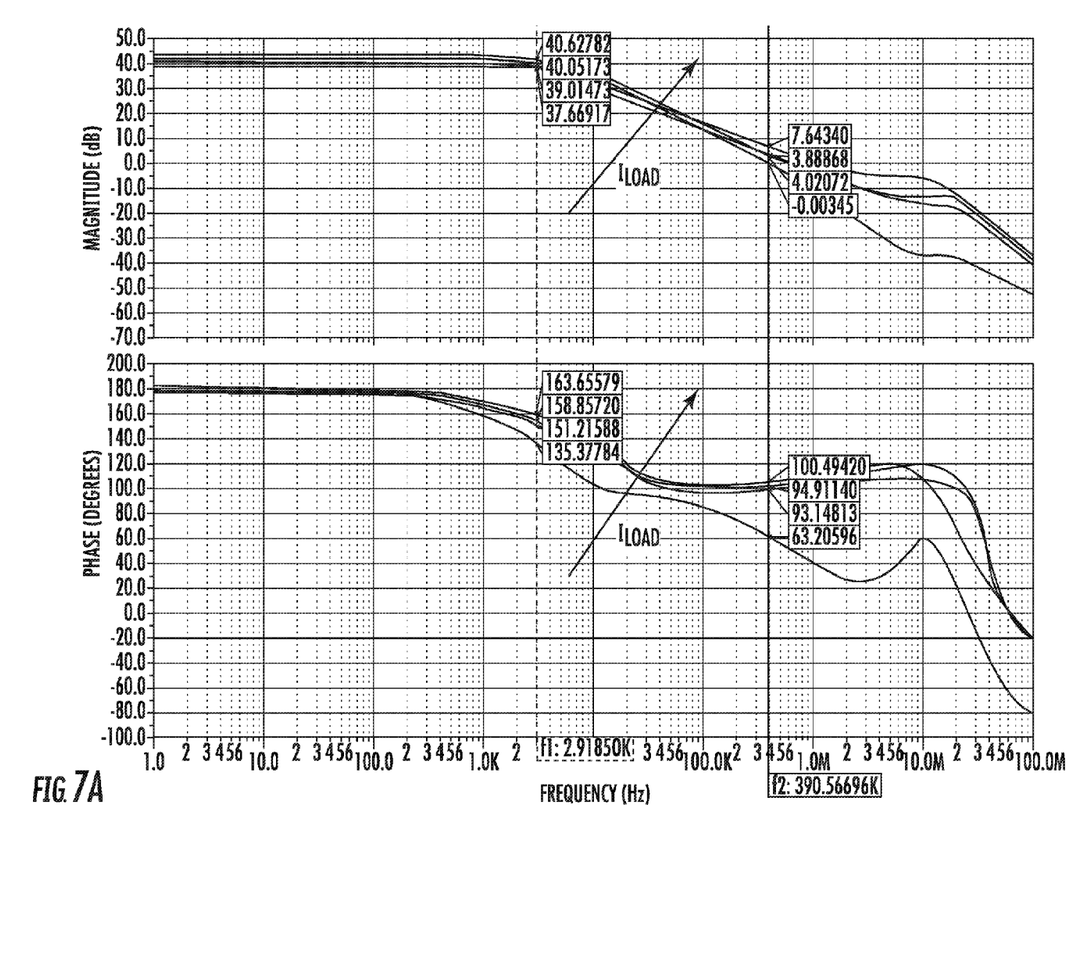
Figure 7B:
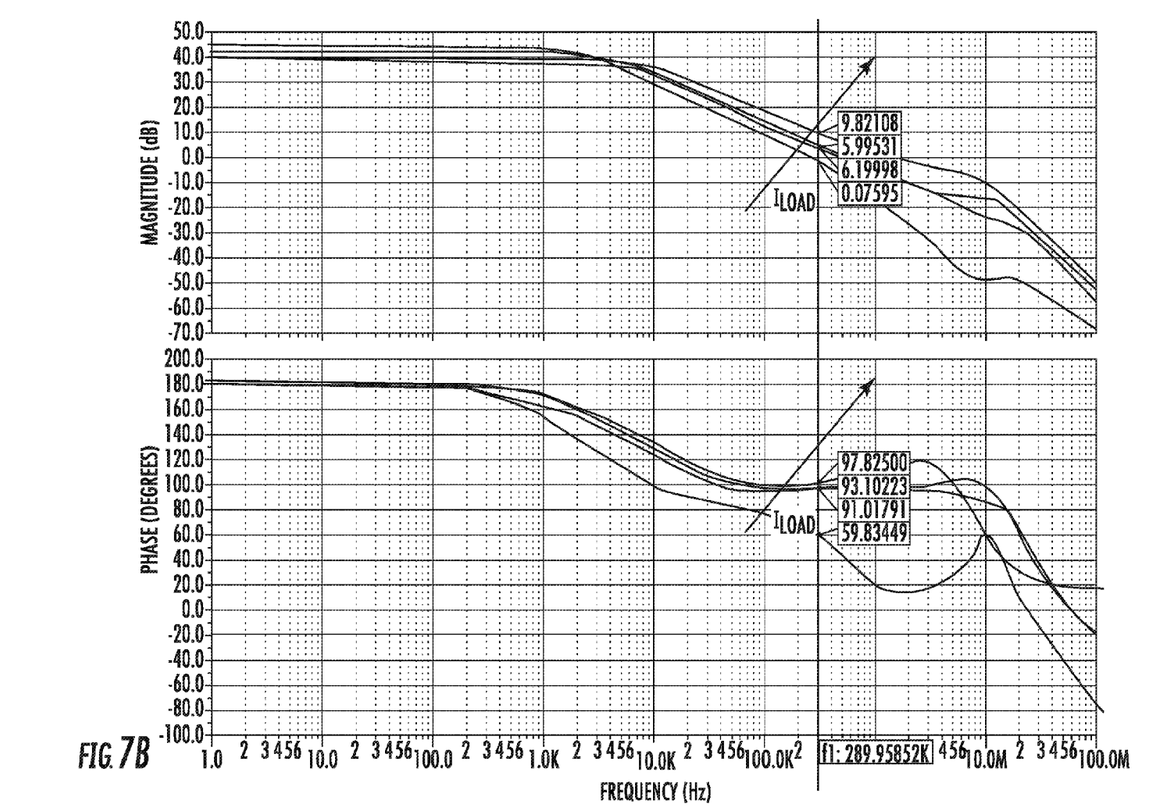

FIGS. 7A and 7B show the plots of the magnitude and phase stability margins, with a value of capacitance of the output capacitor C0 of 200 pF (FIG. 7A) and 100 pF (FIG. 7B); illustrated in each FIG. 7A, 7B are the diagrams for different levels of load current IL, in particular 0, 0.5 mA, 1 mA, and 2 mA (the increase in current is indicated by the arrows in the same FIGS. 7A and 7B).

As may be noted, the stability properties are in general very good: using a value of capacitance of the output capacitor C0 of 200 pF (FIG. 7A), it is possible to obtain in fact a phase margin greater than 85° with a load current IL>0.5 mA, and in any case greater than 63° in the worst case (load current IL=0 mA). Using, instead, a lower value of capacitance of the output capacitor C0, 100 pF (FIG. 7B), it is still possible to obtain a phase margin of 59° (in the worst case of a zero load current IL). Tests and simulations conducted have in any case highlighted a generally low sensitivity to variations of the capacitance C0 of output capacitor 13.

Figure 8:
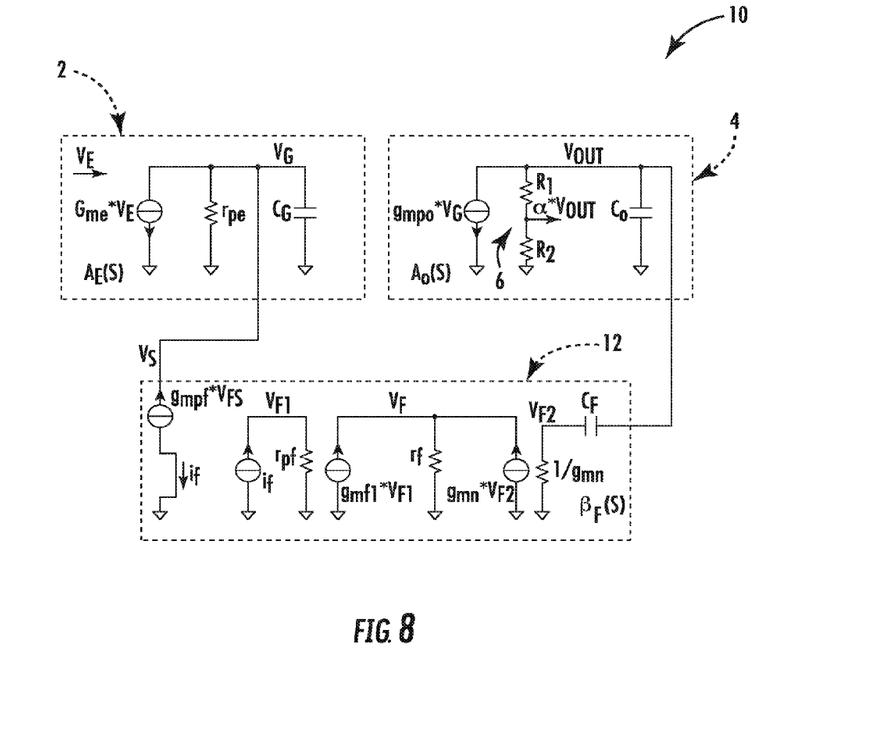
FIG. 8 is a schematic circuit diagram of the voltage regulator of FIG. 2, for determination of the transfer function.

FIG. 8 shows the overall equivalent diagram of the voltage regulator 10, with reference to the block diagram of FIG. 3, using the small-signal equivalent representations of the various circuit components. For convenience of illustration, FIGS. 9A, 9B, and 9C-9D show individually the equivalent diagrams of the error-amplifier stage 2 (FIG. 9A), of the output amplifier stage 4 (FIG. 9B), and of the compensation amplifier stage 12 (FIG. 9C for calculation of the output impedance, and FIG. 9D for calculation of the transfer function).

Figure 9A:
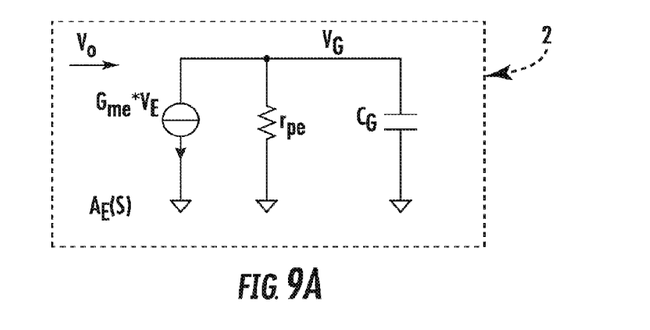
FIGS. 9A-9D are schematic block diagrams of the voltage regulator from FIG. 2 for determination of the corresponding transfer function.

Reference is first made to FIG. 9A, where: the capacitance CG includes the capacitance due to the Miller effect of the output PMOS transistor Mp0 (given by AO·CGD, where AO is the gain of the output amplifier stage 4 and CGD is the capacitance at the gate terminal of the output PMOS transistor Mp0); and Gme and rpe are the equivalent transconductance and the equivalent resistance, respectively, of the error-amplifier stage 2. It may be shown that the transfer function AE(s) of the error-amplifier stage 2 is defined by the following expressions:

$$V_G = -\frac{G_{me} \cdot V_E \cdot r_{pe}}{1 + s \cdot C_G \cdot r_{pe}} \rightarrow A_E(s) = \frac{V_G}{V_E} = -\frac{G_{me} \cdot r_{pe}}{1 + s \cdot C_G \cdot r_{pe}} \quad (1)$$

$$A_E(s) = \frac{-A_{E0}}{\left(1 + \frac{s}{\omega_{pe}}\right)} \quad (2)$$

$$A_{E0} = G_{me} \cdot r_{pe} \quad (3)$$

$$\omega_{pe} = \frac{1}{C_G \cdot r_{pe}}. \quad (4)$$

Figure 9B:
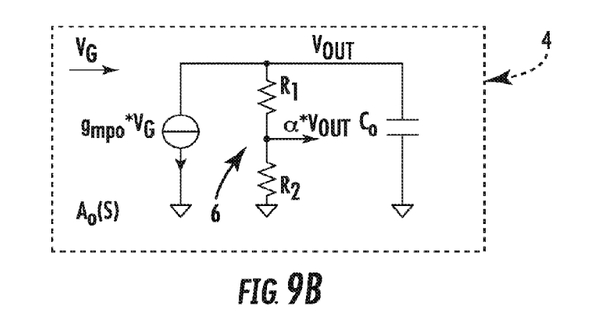

In particular, the transfer function AE(s) may be modeled by a dominant pole cope due to the capacitance CG and given by the expression (4), which is independent of the output parameters, in particular the capacitance of the output capacitor C0. With reference to FIG. 9B, where Δ is the division ratio defined by the resistive divider 6, and gmp0 is the equivalent transconductance of the output amplifier stage 4, the transfer function AO(s) of the output amplifier stage 4 is defined, instead, by the following expressions:

$$V_{OUT} = -\frac{g_{mpo} \cdot V_G \cdot R_{LT}}{1 + s \cdot C_O \cdot R_{LT}} \rightarrow A_O(s) = \frac{V_{OUT}}{V_G} = -\frac{g_{mpo} \cdot R_{LT}}{1 + s \cdot C_O \cdot R_{LT}} \quad (5)$$

$$A_O(s) = \frac{-A_O}{\left(1 + \frac{s}{\omega_{po}}\right)} \quad (6)$$

$$A_O = g_{mpo} \cdot R_{LT} \quad (7)$$

$$\omega_{po} = \frac{1}{C_O \cdot R_{LT}} \quad (8)$$

where $R_{LT}=R_1+R_2$ and may be in the range of 80 kΩ, and $R_1$ and $R_2$ are the resistances of the division resistors 6a and 6b.

Figure 9C:
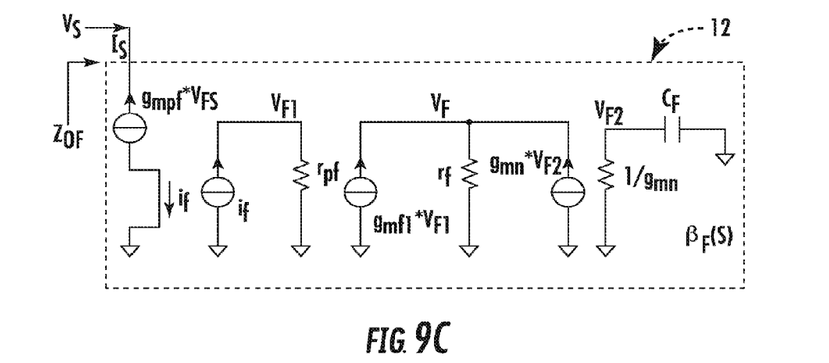

FIG. 9C regards, instead, calculation of the output impedance ZOF of the compensation amplifier stage 12. In FIG. 9C: gmpf is the equivalent transconductance of the discharge PMOS transistor Mp2; rpf is the equivalent resistance seen from the drain terminal of the discharge PMOS transistor Mp2 (in these conditions, it is assumed that the biasing PMOS transistor Mp3 is not in conduction and that the biasing NMOS transistor Mn2 is working in the linear region); if is the current that flows in the biasing NMOS transistor Mn2; gmf1 is the equivalent transconductance of the enabling PMOS transistor Mp4; rf is the equivalent resistance of the coupling PMOS transistor Mp1; and gmn is the equivalent transconductance of the biasing NMOS transistor Mn1. The output impedance ZOF is given by the following expression:

$$I_s \approx \frac{V_s}{g_{mf1} \cdot r_{pf} \cdot r_f} \to Z_{OF} \approx g_{mf1} \cdot r_{pf} \cdot r_f.$$

Figure 9D:
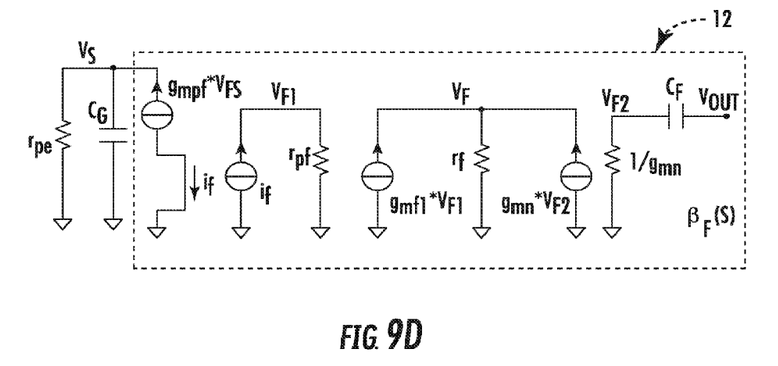

FIG. 9D regards, instead, calculation of the transfer function of the compensation amplifier stage 12, for which the following expressions apply:

$$\beta_F(s) = \frac{s \cdot K_F}{\left(1 + \frac{s}{\omega_{ps}}\right) \cdot \left(1 + \frac{s}{\omega_{pf}}\right)}$$

$$K_F = C_F \cdot r_f$$

$$\omega_{pe} = C_G \cdot r_{pe}$$

$$\omega_{ps} = (1 + g_{mpf} \cdot r_{pe}) \cdot \omega_{pe} \gg \omega_{pe}$$

$$\omega_{pf} = \frac{g_{mn}}{C_F}.$$

Consequently, the compensation amplifier stage 12 of the voltage regulator 10 has a very high output impedance (for example, in the range of some megaohms), and a transfer function in which both of the poles are positioned at very high frequencies with respect to the operating frequency band, or range, of the voltage regulator 10 (for example, the operating frequency range is in the range of megahertz, and the poles are normally at a distance of at least one decade from the range). The compensation amplifier stage 12 thus effectively performs a derivator function given that it is without poles for the operating frequencies of interest, and has just one zero. The transfer function may thus effectively be approximated as $$\beta_F(s) = s \cdot K_F.$$

The advantages of the approach disclosed herein emerge clearly from the foregoing description. In particular, for compensation a derivator scheme is used with a very fast response, capable of driving the load (represented by the gate terminal of the large output PMOS transistor Mp0) with an output stage implemented with a fast source-follower transistor, and with very low impedance when fast intervention is required. This characteristic may be particularly advantageous in voltage regulation for supplying charge-pump circuits, the current demand of which is impulsive with sudden variations (in the range of a few nanoseconds) from zero to several milliamps.

The compensation amplifier stage 12 operates as a pure derivator for the operating frequencies of interest and enables implementation of an effective separation of the poles and definition of a dominant pole, which is independent of the output parameters (in particular, the capacitance C0 of the output capacitor 13). The approach described may further enable a high stability to be obtained for all the possible conditions of load and values of load current IL. In particular, the stability margin is greater than 60° in the worst case and greater than 85° in operating conditions of moderate load.

Furthermore, a reduced overshoot in the current consumption from the supply source is obtained, at the most in the range of 10% in any operating condition. In other words, the voltage regulator 10 implements an effective filtering of the current overshoots so that the waveform of the same current is smoothed and substantially without oscillations or spikes.

As mentioned previously, this characteristic may be particularly advantageous in the case of applications that require a high degree of security, or else reduced noise in the case of radiofrequency circuits. Furthermore, the area occupation is certainly reduced as compared to known approaches, for example less than 0.021 mm2, due to the use of an integrated output capacitor 13 of contained dimensions and of a low value, for example in the range of 100 pF.

The voltage regulator 10 further presents: a PSRR of less of −15 dB for all the operating frequencies; a reduced drop in voltage ΔV, for example less than 100 mV during the transients; a lower static current consumption, for example less than 80 µA; and a fast response to input current steps with an amplitude comprised in a wide range of values, for example between 100 µA and 10 mA. The voltage regulator 10 may thus advantageously be used to supply a dedicated internal voltage source, for example, in combination with a charge pump, this being a case where a low efficiency of the charge pump would in fact amplify static and dynamic current consumption.

Figure 10:
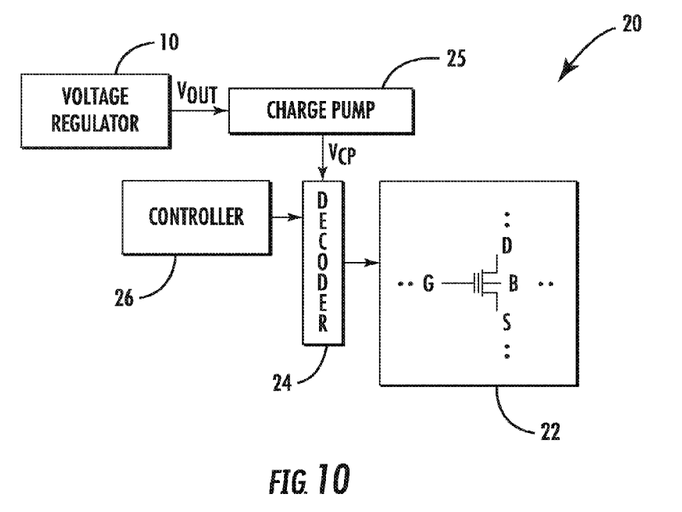
FIG. 10 is a schematic diagram of an electronic device, in particular, a nonvolatile-memory device, including the voltage regulator of FIG. 2.

In this regard, FIG. 10 shows a nonvolatile memory device 20, in particular of a flash type (only the parts significant for the present discussion are illustrated in FIG. 10). The nonvolatile memory device 20 comprises: an array of memory cells 22 (only one of which is shown by way of example); a decoder 24, designed to address the memory cells 22 for reading and programming operations; a DC/DC converter device including the voltage regulator 10; a charge pump 25, which supplies a boosted voltage VCP to the decoder 24 starting from the regulated output voltage Vout supplied by the voltage regulator 10; and a controller 26, for example including a microprocessor or a microcontroller (or similar processing element), operatively coupled to the decoder 24.

Finally, it is clear that modifications and variations may be made to what has been described and illustrated herein, without thereby departing from the scope of the present invention, as defined in the annexed claims. In particular, it is emphasized once more that the approach described may find advantageous application in all the devices that envision use of a voltage-regulator circuit, in which improvement of the electrical performance is required, in particular with reference to the characteristics of current consumption, area occupation and security.

What is claimed is:

1. A voltage-regulator device comprising:
    an error-amplifier stage having a first input and a second input configured to receive a first reference voltage and a feedback voltage, respectively;
    an output amplifier stage having an input coupled to an output of the error-amplifier stage, the output amplifier stage configured to generate an output voltage related to the first reference voltage by an amplification factor;
    a first feedback loop coupled between an output of the output amplifier stage and the second input of the error-amplifier stage, the first feedback loop configured to generate the feedback voltage based on the output voltage; and
    a second feedback loop coupled between the output of the output amplifier stage and the input of the output amplifier stage, the second feedback loop configured to cause a variation of a first biasing voltage of the input of the output amplifier stage in response to a variation of the output voltage, wherein the second feedback loop comprises a compensation stage configured to implement a derivation circuit having a frequency response with at least one pole, outside an operating frequency band of the voltage-regulator device, and a single zero, and wherein the voltage-regulator device has a frequency response with a dominant pole at the output of the error-amplifier stage, and at a frequency less than the at least one pole in the frequency response of the second feedback loop.

2. The voltage-regulator device of claim 1, wherein the second feedback loop has a greater response speed than the first feedback loop.

3. The voltage-regulator device of claim 1, wherein the second feedback loop comprises a coupling-capacitor element coupled between the output of the output amplifier stage and a first internal node, and a driving module having an input coupled to the first internal node and an output coupled to the input of the output amplifier stage, the driving module configured to generate a compensation voltage for driving the output amplifier stage.

4. The voltage-regulator device according to claim 3, wherein the output amplifier stage comprises:
an output transistor having first and second conduction terminals coupled between the output of the output amplifier stage and a supply voltage, and a control terminal coupled to the input of the output amplifier stage and configured to receive the first biasing voltage, wherein the compensation voltage is configured to drive the control terminal of the output transistor.

5. A voltage-regulator device, comprising:
an error-amplifier stage configured to receive a first reference voltage and a feedback voltage;
an output amplifier stage coupled to the error-amplifier stage, and configured to generate an output voltage related to the first reference voltage by an amplification factor;
a feedback stage, implementing a first feedback loop, coupled to the output amplifier stage and configured to generate the feedback voltage based upon the output voltage; and
a compensation stage, implementing a second feedback loop, coupled in feedback with the output amplifier stage and configured to cause, in response to a variation of the output voltage, a corresponding variation of a first biasing voltage for the output amplifier stage, wherein the compensation stage is configured to implement a derivation circuit having a frequency response with at least one pole outside an operating frequency band of the voltage-regulator device, and a single zero, wherein the second feedback loop has a greater response speed than the first feedback loop.

6. The voltage-regulator device of claim 5, wherein the compensation stage comprises a coupling-capacitor element coupled between the output amplifier stage and a first internal node, and a driving module coupled between the first internal node and the output amplifier stage, the driving module being configured to generate a compensation voltage for driving the output amplifier stage.

7. The voltage-regulator device of claim 6, wherein the output amplifier stage comprises:
an output transistor having first and second conduction terminals coupled between an output of the output amplifier stage and a supply voltage, and a control terminal coupled to an input of the output amplifier stage and configured to receive the first biasing voltage, the compensation voltage configured to drive the control terminal.

8. The voltage-regulator device of claim 7, wherein the driving module is configured to enable, in response to the variation of the output voltage, a current path towards the input of the output amplifier stage.

9. The voltage-regulator device of claim 8, wherein the driving module comprises a discharge transistor coupled to the input of the output amplifier stage and configured to implement the current path and supply the compensation voltage, wherein the discharge transistor is configured in a voltage-follower mode.

10. The voltage-regulator device of claim 5, wherein the voltage-regulator device has a frequency response with a dominant pole at an output of the error-amplifier stage, and at a frequency less than the at least one pole in the frequency response of the compensation stage.

11. A voltage-regulator device comprising:
an error-amplifier stage having a first input and a second input configured to receive a first reference voltage and a feedback voltage, respectively;
an output amplifier stage having an input coupled to an output of the error-amplifier stage, the output amplifier stage configured to generate an output voltage related to the first reference voltage by an amplification factor;
a first feedback loop having a first end coupled to form a node with an output of the output amplifier stage, the first feedback loop further having a second end coupled to form a node with the second input of the error-amplifier stage, the first feedback loop configured to generate the feedback voltage based on the output voltage; and
a derivation circuit, implementing a second feedback loop, having a first end coupled to form a node with the output of the output amplifier stage and the first end of the first feedback loop, the derivation circuit further having a second end coupled to form a node with the input of the output amplifier stage, the derivation circuit configured to cause a variation of a first biasing voltage of the input of the output amplifier stage in response to a variation of the output voltage, wherein an output voltage of the voltage-regulator device is drawn from the node formed by the first end of the first feedback loop and the first end of the second feedback loop.

12. The voltage-regulator device of claim 11, wherein the derivation circuit comprises a coupling-capacitor element coupled between the output of the output amplifier stage and a first internal node, and a driving module having an input coupled to the first internal node and an output coupled to the input of the output amplifier stage, the driving module configured to generate a compensation voltage for driving the output amplifier stage.

13. The voltage-regulator device of claim 12, wherein the driving module is configured to enable, in response to the variation of the output voltage, a current path towards the input of the output amplifier stage.

14. The voltage-regulator device of claim 13, wherein the driving module comprises a discharge transistor coupled to the input of the output amplifier stage and configured to implement the current path and supply the compensation voltage, wherein the discharge transistor is configured in a voltage-follower mode.

15. The voltage-regulator device of claim 14, wherein the driving module further comprises an enabling transistor having a conduction terminal coupled to the first internal node, and a control terminal, wherein the conduction terminal of the enabling transistor is configured to have a control voltage thereon, the control voltage having a variation corresponding to the output voltage, the conduction terminal of the enabling transistor being further configured to enable the discharge transistor to define the current path and determine extraction of current from the output amplifier stage.

16. The voltage-regulator device of claim 15, wherein the discharge transistor has first and second conduction terminals coupled between the input of the output amplifier stage and a second internal node, and a control terminal coupled to a third internal node, wherein the driving module further comprises:
- a coupling transistor diode-coupled between a supply voltage and the third internal node; and
- a first biasing transistor having first and second conduction terminals coupled between the second internal node and a second reference voltage, and a control terminal configured to receive a second biasing voltage, wherein the discharge transistor and the first biasing transistor are configured to define the current path.

17. The voltage-regulator device of claim 16, wherein the driving module further comprises:
- a second biasing transistor having first and second conduction terminals coupled between the third internal node and the first internal node, and a control terminal configured to receive a third biasing voltage; and
- a third biasing transistor having first and second conduction terminals coupled between the second internal node and the control terminal of the enabling transistor, and a control terminal configured to receive the third biasing voltage.

* * * * *